(12) United States Patent
Wada et al.

(10) Patent No.: US 9,299,902 B2
(45) Date of Patent: Mar. 29, 2016

(54) LIGHT EMITTING DEVICE

(71) Applicant: TOYODA GOSEI CO., LTD., Kiyosu (JP)

(72) Inventors: Satoshi Wada, Kiyosu (JP); Koichi Goshonoo, Kiyosu (JP); Toshimasa Hayashi, Kiyosu (JP)

(73) Assignee: TOYODA GOSEI CO., LTD., Kiyosu-shi, Aichi-ken (JP)

( * ) Notice: Subject to any disclaimer, the term of this patent is extended or adjusted under 35 U.S.C. 154(b) by 0 days.

(21) Appl. No.: 14/507,472

(22) Filed: Oct. 6, 2014

(65) Prior Publication Data
US 2015/0097195 A1    Apr. 9, 2015

(30) Foreign Application Priority Data
Oct. 7, 2013   (JP) .................................. 2013-210610

(51) Int. Cl.
| | | |
|---|---|---|
| *H01L 33/00* | (2010.01) | |
| *H01L 33/62* | (2010.01) | |
| *H01L 33/60* | (2010.01) | |
| *H01L 33/50* | (2010.01) | |

(52) U.S. Cl.
CPC ................ *H01L 33/62* (2013.01); *H01L 33/60* (2013.01); *H01L 33/508* (2013.01)

(58) Field of Classification Search
CPC ......... H01L 33/16; H01L 33/18; H01L 33/20; H01L 33/22; H01L 33/24; H01L 33/26; H01L 33/30; H01L 33/32; H01L 33/36; H01L 33/38; H01L 33/50; H01L 33/507; H01L 33/62
USPC ........................... 257/76, 94, 98, 99, 100, 103
See application file for complete search history.

(56) References Cited

U.S. PATENT DOCUMENTS

| | | | | |
|---|---|---|---|---|
| 6,107,649 | A * | 8/2000 | Zhao .............................. | 257/138 |
| 7,705,366 | B2 * | 4/2010 | Seo ........................ | H01L 33/483 |
| | | | | 257/100 |
| 8,044,415 | B2 * | 10/2011 | Messere et al. .................. | 257/88 |
| 8,138,517 | B2 * | 3/2012 | Chiu ...................... | H01L 33/486 |
| | | | | 257/100 |
| 8,785,957 | B2 * | 7/2014 | Hata ..................... | H01L 33/501 |
| | | | | 257/100 |
| 2004/0150082 | A1 * | 8/2004 | Kajiwara et al. ............... | 257/678 |
| 2008/0224282 | A1 * | 9/2008 | Ashida et al. .................. | 257/669 |
| 2009/0224273 | A1 | 9/2009 | Sakamoto et al. | |
| 2009/0245310 | A1 * | 10/2009 | Miyake et al. ........... | 372/44.011 |
| 2013/0277681 | A1 * | 10/2013 | Wada et al. ...................... | 257/76 |

FOREIGN PATENT DOCUMENTS

| | | |
|---|---|---|
| JP | 2007-207895 A | 8/2007 |
| JP | 2011-228366 A | 11/2011 |

* cited by examiner

*Primary Examiner* — Jay C Kim
(74) *Attorney, Agent, or Firm* — McGinn IP Law Group PLLC

(57) ABSTRACT

A light emitting device includes a double-sided electrode type semiconductor light emitting element that has a first electrode formed on a front side of the double-sided type semiconductor light emitting element and a second electrode formed on a rear side of the double sided type semiconductor light emitting element and is configured to emit light from a side wall surface of the double-sided electrode type semiconductor light emitting element, a first lead frame that is bonded to a whole area of one face of the first electrode, a second lead frame that is bonded to a whole area of one face of the second electrode, and a case in which a portion of the first lead frame and a portion of the second lead frame is embedded.

11 Claims, 5 Drawing Sheets

BACK SIDE ⟵⟶ FRONT SIDE

LIGHT EMITTING DEVICE

CROSS-REFERENCE TO RELATED APPLICATIONS

This application claims the benefit of Japanese Patent Application No. 2013-210610 (filed on Oct. 7, 2013), the entire contents of which are hereby incorporated by reference.

BACKGROUND

1. Technical Field

The present invention relates to a light emitting device and, more particularly, to a light emitting device using a double-sided electrode type semiconductor light emitting element.

2. Related Art

In JP-A-2011-228366, a light emitting device is disclosed which includes a semiconductor light emitting element, first and second electrodes respectively provided on the front and rear surfaces of the semiconductor light emitting element, first and second lead wires respectively connected to the first and second electrodes, and a glass for sealing the periphery of a portion of the first and second lead wires and the semiconductor light emitting element.

In JP-A-2007-207895, a light emitting device is disclosed which includes a container having a recessed opening made of an inorganic translucent material, a light emitting element accommodated in the recessed opening via a glass bonding material, a lid made of an inorganic translucent material and closing the recessed opening, first and second electrodes respectively formed on the upper and lower surfaces of the light emitting element, a first external connection conductor and a second external connection conductor. The first external connection conductor is conductively connected to the first electrode and penetrates the container. A portion of the first external connection conductor is exposed on the surface of the container. The second external connection conductor is conductively connected to the second electrode and penetrates the lid. A portion of the second external connection conductor is exposed on the surface of the lid.

Conventionally, there has been known a light emitting device which includes a semiconductor light emitting element mounted on an inner bottom surface of an opening of a package and a lead frame insert-molded to the package.

In this light emitting device, a wire bonding method of connecting a bonding pad formed on the surface of the semiconductor light emitting element with the lead frame by a bonding wire has been used in order to electrically connect the semiconductor light emitting element with the lead frame.

However, this light emitting device has the following disadvantages.

(a) Since the dimensions of the semiconductor light emitting element are defined by the bonding pad, it is difficult to miniaturize the semiconductor light emitting element.

(b) Since the dimensions of the opening of the package are defined by a bonding capillary, it is difficult to miniaturize the opening of the package.

(c) Adhesive made of a synthetic resin material is used in order to mount the semiconductor light emitting element on the inner bottom surface of the opening of the package. However, since the thermal conductivity of the adhesive is low, the heat dissipation efficiency of heat generated by the semiconductor light emitting element is low.

(d) Although an inner wall surface of the opening of the package is a reflective part (reflector), the light emitted from a side wall surface of the semiconductor light emitting element is transmitted through the reflective part. Accordingly, the light is not emitted from the opening and therefore the light emission efficiency is low.

In the technique disclosed in JP-A-2011-228366 or JP-A-2007-207895, a double-sided electrode type semiconductor light emitting element is used in which electrodes are formed on both front and rear surfaces and respective lead wires or respective external connection conductors are directly connected to respective electrodes.

Namely, since the technique disclosed in JP-A-2011-228366 or JP-A-2007-207895 does not use a wire bonding method, it is possible to avoid the disadvantages of the (a) and (b).

Further, since, in the technique disclosed in JP-A-2011-228366 or JP-A-2007-207895, the heat generated by the semiconductor light emitting element can be dissipated to the lead wires or the external connection conductors from the electrodes on both front and rear surfaces, it is possible to avoid the disadvantage of the (c).

Meanwhile, recently, a demand for a side-view type light emitting device (side light emitting device) has increased, as a thin light emitting device used for a backlight light source or the like of a liquid crystal display. In the side-view type light emitting device, thinning is especially required.

However, in the techniques disclosed in JP-A-2011-228366 or JP-A-2007-207895, it is difficult to cause the light emitting device to be thinner.

Further, in the side-view type light emitting device, a control for the directivity of light emitted from the side is required.

However, in the technique disclosed in JP-A-2011-228366 or JP-A-2007-207895, light is emitted in the circumferential direction of the entire side wall surface of the semiconductor light emitting element and a configuration corresponding to the reflective part is not provided. Accordingly, the disadvantage of the (d) is removed but it is difficult to control the directivity of the emitted light.

Therefore, a thin light emitting device preferred for the side-view type is required in which the directivity of the light emitted from the side can be controlled.

The present invention has been made to satisfy the above-described demands and an object thereof is to provide a thin light emitting device with low cost in which the heat dissipation efficiency and light emission efficiency of the semiconductor light emitting element are high and the directivity of the light emitted from the side can be controlled.

SUMMARY

The present inventors has intensively studied in order to solve the problems and reached each aspect of the present invention as described below.

<First Aspect>

According to an aspect of the invention, a light emitting device includes a double-sided electrode type semiconductor light emitting element that has a first electrode formed on a front side of the double-sided type semiconductor light emitting element and a second electrode formed on a rear side of the double sided type semiconductor light emitting element and is configured to emit light from a side wall surface of the double-sided electrode type semiconductor light emitting element, a first lead frame that is bonded to a whole area of one face of the first electrode, a second lead frame that is bonded to a whole area of one face of the second electrode, and a case in which a portion of the first lead frame and a portion of the second lead frame is embedded. The semiconductor light emitting element is fixedly bonded by being disposed between the first lead frame and the second lead frame, the first lead frame includes a first reflective portion formed at the portion which obliquely faces the side wall surface of the semiconductor light emitting element, and the second lead frame includes a second reflective portion formed at the portion which obliquely faces the side wall surface of the semiconductor light emitting element.

Accordingly, since, in the first aspect, a wire bonding method is not used, it is possible to avoid the disadvantages of the (a) and (b).

Further, since, in the first aspect, the heat generated by the semiconductor light emitting element can be directly dissipated to respective lead frames from the electrodes on both front and rear surfaces, it is possible to avoid the disadvantage of the (c) and it is possible to improve the heat dissipation efficiency of the semiconductor light emitting element.

Further, since, in the first aspect, the semiconductor light emitting element is sandwiched between the lead frames and a portion of respective lead frames is embedded in the case, it is possible to cause the light emitting device, as a whole, to be thinner.

Furthermore, since, in the first aspect, respective lead frames 12, 13 are provided with the first reflective portion and the second reflective portion, it is possible to control the directivity of the light emitted from the side of the light emitting device.

Further, since respective reflective portions are parts of respective lead frames, the light is not transmitted through the reflective portions. Accordingly, it is possible to avoid the disadvantage of the (d) and it is possible to improve the light emission efficiency of the light emitting device.

Particularly, in the case where respective lead frames are formed of metallic material having high reflectivity, the reflectivity of respective reflective portions is also improved. Accordingly, it is possible to further improve the light emission efficiency of the light emitting device.

Further, since, in the first aspect, the whole surface of respective electrodes is bonded to respective lead frames, it is possible to lower the threshold voltage of the semiconductor light emitting element, in addition to being able to equalize the current density of current flowing through respective lead frames from respective electrodes.

Additionally, since the structure of the light emitting device is simple in the first aspect, it is possible to reduce the cost.

<Second Aspect>

In the second aspect, the light emitting device of 1st aspect further includes a void that is formed at the portion inside the case 14 surrounded by the side wall surface of the semiconductor light emitting element and the first and second reflective portions, and a sealing material that is injected and filled into the void and configured to seal the side wall surface of the semiconductor light emitting element. Phosphors are contained in the sealing material.

Accordingly, in the second aspect, the emitted light (e.g., blue light) of the semiconductor light emitting element can be converted into another color light (e.g., white light) by the phosphors and then irradiated to the outside from the light emitting device.

<Third Aspect>

In the third aspect based on the first aspect or the second aspect, the first reflective portion and the second reflective portion are formed separately for two side wall surfaces of the semiconductor light emitting element opposed to each other.

Accordingly, since, in the third aspect, each of the first reflective portion and the second reflective portion is provided by two, it is possible to more optimally control the directivity of the light emitted from the light emitting device. In this way, it is possible to further improve the light emission efficiency of the light emitting device.

<Fourth Aspect>

In the fourth aspect based on any one of the first to third aspects, the semiconductor light emitting element is a gallium nitride-based LED having a flat rectangular parallelepiped shape, and two side wall surfaces of the semiconductor light emitting element corresponding to an a-plane that is a non-polar plane of the gallium nitride crystal are arranged so as to face the front side and rear side of the light emitting device.

In the gallium nitride-based LED, piezoelectric field is generated in the normal direction (c-axis direction) of the c-plane that is a crystal plane of the gallium nitride crystal. Accordingly, the light emission efficiency of the emitted light in the normal direction of the c-plane is low whereas the light emission efficiency of the emitted light in the normal direction of the a-plane is improved.

Since, in the fourth aspect, two side wall surfaces corresponding to the a-plane are arranged so as to face the front side and rear side of the light emitting device, the emitted light in the normal direction of the a-plane can be irradiated to the outside of the light emitting device, so that it is possible to improve the light emission efficiency of the light emitting device.

<Fifth Aspect>

In the fifth aspect based on the fourth aspect, two side wall surfaces of the semiconductor light emitting element corresponding to the a-plane are formed with fine irregularities. Accordingly, in the fifth aspect, the fine irregularities formed on the a-plane allow the emitted light in the normal direction of the a-plane to be irradiated over a wide range in the horizontal direction of the front side or rear side of the light emitting device. Accordingly, it is possible to improve the light emission efficiency of the light emitting device.

<Sixth Aspect>

In the sixth aspect based on any one of the first to fifth aspects, bonding material layers are formed on the surfaces of the first electrode and the second electrode, and the lead frames and the electrodes are bonded to each other via the bonding material layers.

Accordingly, in the sixth aspect, respective lead frames can be more securely bonded to respective electrodes via the bonding material layers. Further, it is possible to further improve the heat dissipation efficiency in the first aspect and it is possible to further equalize the current density in the first aspect. Furthermore, it is possible to improve the bonding strength between respective lead frames and respective electrodes.

<Seventh Aspect>

In the seventh aspect based on any one of the first to sixth aspect, the portions of the first lead frame and the second lead frame which protrude from the case are bent so as to follow an outer surface of the case.

Accordingly, in the seventh aspect, the semiconductor light emitting element is fixedly bonded to respective lead frames and therefore the bending of respective lead frames can be easily performed, as described in the first and sixth aspects. Accordingly, it is possible to reduce the manufacturing cost of the light emitting device.

DETAILED DESCRIPTION

Figure 1A:
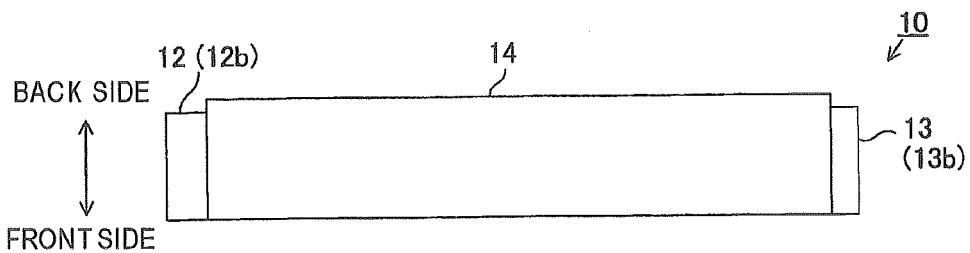
FIG. 1A is a top view of a light emitting device 10 according to a first embodiment of the present invention.

Hereinafter, respective embodiments of the present invention will be described with reference to the drawings. In respective embodiments, the same reference numerals are applied to the same components and elements and a duplicated description of the same components and elements will be omitted.

Further, in each drawing, in order to simplify the description, the size, shape and arrangement of the components are schematically shown in an exaggerated manner. Further, the size, shape and arrangement of the components are different from the actual.

First Embodiment

As shown in FIG. 1A to FIG. 4D, a light emitting device 10 of a first embodiment is a side-view type light emitting device (side light emitting device) which includes an LED (Light Emitting Diode) chip 11, a first lead frame 12 (side portions 12a to 12c and a reflective portion 12d), a second lead frame 13 (side portions 13a to 13c and a reflective portion 13d), a case 14 (a void 14a) and a sealing material 15. The overall shape of the light emitting device 10 is a substantially flat rectangular parallelepiped shape.

[Configuration of Light Emitting Device 10]

Figure 2A:
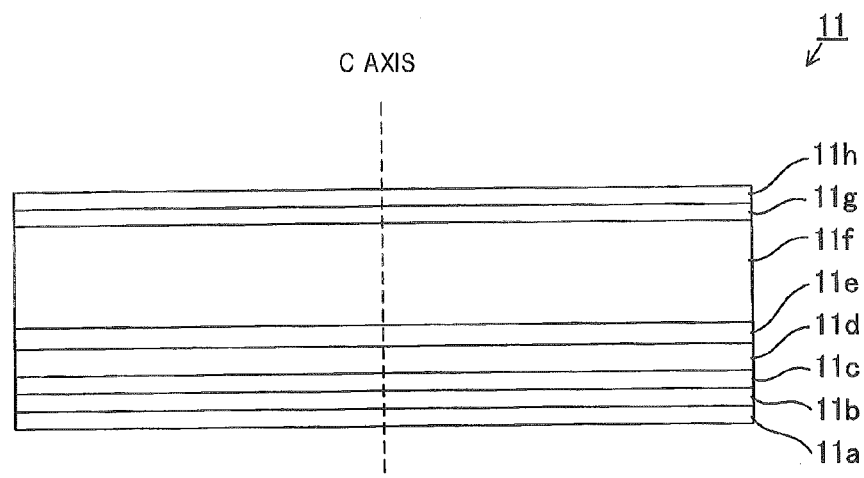
FIG. 2A is a front view of an LED chip 11 included in the light emitting device 10 and FIG. 2B is a top view of the LED chip 11.
Figure 2B:
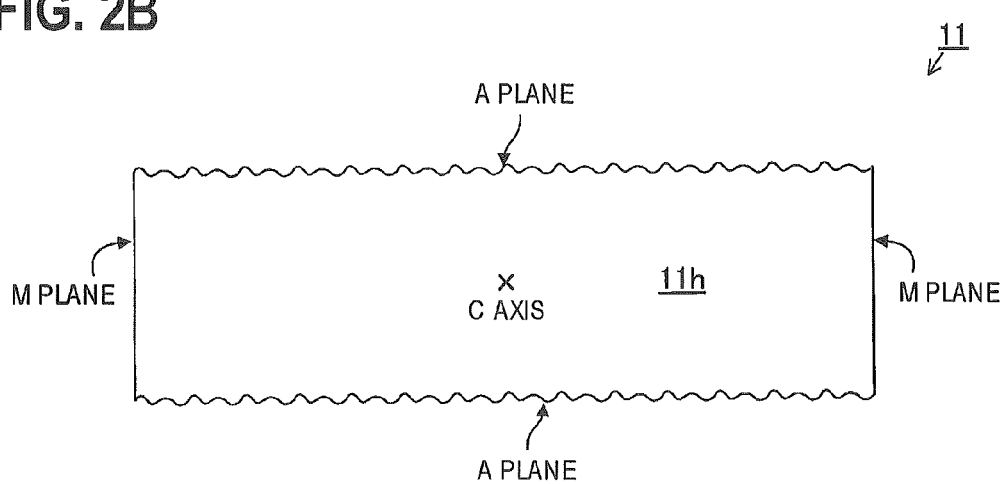

As shown in FIGS. 2A and 2B, the LED chip 11 is a gallium nitride-based blue LED in which a solder layer 11a, an electrode layer 11b, a P-type semiconductor layer 11c, a light emitting layer 11d, an N-type semiconductor layer 11e, a conductive board 11f, an electrode layer 11g and a solder layer 11h are stacked in this order from the bottom to the top. The overall shape of the LED chip 11 is a flat rectangular parallelepiped shape.

Each of the layers 11a, 11b is formed on the whole surface of the lower side of the LED chip 11 and each of the layers 11g, 11h is formed on the whole surface of the upper side of the LED chip 11.

Each of the solder layers 11a, 11h is made of, for example, gold-tin alloy solder and formed using a PVD (Physical Vapor Deposition) method.

Each of the electrode layers 11b, 11h is made of, for example, a metallic layer and formed using the PVD method. The metallic layer can be electrically connected with the semiconductor layers 11c, 11e such as ITO (Indium Tin Oxide) and IZO (Indium Zinc Oxide).

In addition, a build-up structure may be employed on the electrode forming surface of the semiconductor layers 11c, 11e.

As shown in FIGS. 2A and 2B, each of the layers 11c to 11e and the conductive board 11f are made of gallium nitride.

Each of the layers 11c to 11e is formed on the conductive board 11f using an epitaxial growth method.

Namely, the transverse section of respective layers 11c to 11e and the conductive board 11f is a c-plane that is a polar plane of the gallium nitride crystal. Each of the layers 11c to 11e is epitaxially grown using a c-axis along the normal direction of the c-plane as a growth axis.

Further, in each of the layers 11c to 11e and the conductive board 11f, a long-side wall surface (both end surfaces in the width direction) along the longitudinal direction is an a-plane that is a non-polar plane of the gallium nitride crystal. A short-side wall surface (both end surfaces in the longitudinal direction) along the width direction is an m-plane that is a non-polar plane of the gallium nitride crystal.

As shown in FIGS. 1A to 1D, FIGS. 3A and 3B and FIGS. 4A to 4D, respective lead frames (a wiring plate, an electrode plate and a bus bar) 12, 13 are formed by press-forming a rectangular sheet of a metallic material (e.g., pure copper, copper-based alloy or the like) where thermal conductivity is high and electrical resistance is low.

The lead frame 12 is provided with respective side portions 12a to 12c bent to form a substantially J shape.

The longitudinal direction of the LED chip 11 is disposed along the longitudinal direction of the side portion 12a. A lower side of the side portion 12a is bonded to (in contact with) the whole surface of the upper side (the solder layer 11h shown in FIGS. 2A and 2B) of the LED chip 11.

An outer side of the side portion 12b is exposed from the side surface (the side) of the case 14.

A lower side of the side portion 12c is exposed from the lower surface (the lower side) of the case 14.

As shown in FIGS. 1A to 1D, FIGS. 3A and 3B and FIGS. 4A and 4D, the lead frame 13 is provided with respective side portions 13a to 13c bent to form a substantially 9-character shape.

The longitudinal direction of the LED chip 11 is disposed along the longitudinal direction of the side portion 13a. An upper side of the side portion 13a is bonded to (in contact with) the whole surface of the lower side (the solder layer 11a shown in FIGS. 2A and 2B) of the LED chip 11.

An outer side of the side portion 13b is exposed from the side surface of the case 14.

A lower side of the side portion 13c is exposed from the lower surface of the case 14.

Specifically, the upper and lower sides of the LED chip 11 are fixedly bonded by being sandwiched and crimped between the side portions 12a, 13a of respective lead frames 12, 13.

In addition, the side portions 12b and 12c, 13b and 13c of respective lead frames 12, 13 are external terminals of the light emitting device 10. When, as a chip component, the light emitting device 10 is surface-mounted to a wiring board (not shown), the side portions 12b and 12c, 13b and 13c are connected to the wiring material of the wiring board using a solder or the like.

As shown in FIGS. 1A to 1D, FIGS. 3A and 3B and FIGS. 4A to 4D, the case 14 is integrally formed by injection-molding of a glass material or a thermoplastic synthetic resin material (e.g., silicone resin, epoxy resin or the like) in which the thermal conductivity and thermal emissivity are high and which has an insulating property.

Respective lead frames 12, 13 are insert-molded (mold-formed) during the injection molding of the case 14 so that each of the side portions 12a, 13a is embedded in the case 14.

As shown in FIGS. 1A to 1D, FIGS. 3A and 3B and FIGS. 4A to 4D, the portion inside the case 14 surrounded by the side wall surface of the LED chip 11 and the side portions 12a, 13a of respective lead frames 12, 13 is formed with a substantially rectangular parallelepiped void 14a.

A sealing material 15 is injected and filled into the void 14a. The side wall surface of the LED chip 11 is sealed by the sealing material 15.

Figure 3A:
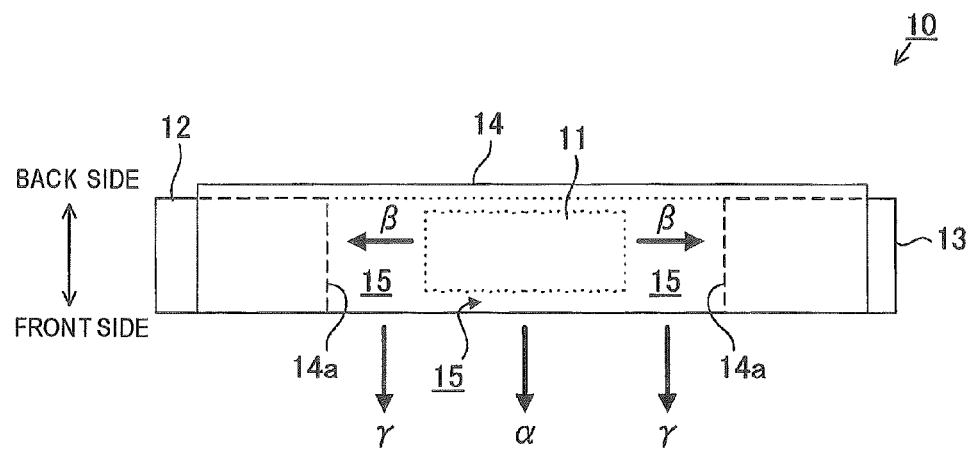
FIG. 3A is a perspective top view of a main part of the light emitting device 10 and FIG. 3B is a perspective left-side view of a main part of the light emitting device 10.

Here, the side wall surface of the LED chip 11 refers to the left and right side wall surfaces and a lower side surface (front-side wall surface) shown in FIG. 3A.

The sealing material 15 is made of thermosetting synthetic resin material (e.g., silicone resin, epoxy resin or the like) or thermoplastic synthetic resin material (e.g., polycarbonate resin, acrylic resin or the like), which contains phosphors (e.g., YAG (Yttrium Aluminum Garnet)-based phosphor, etc.). The portions of the side portions 12a, 13a of respective lead frames 12, 13, which is exposed into the void 14a, are reflective portions (reflector) 12d, 13d for reflecting the light emitted from the LED chip 11.

Figure 1B:
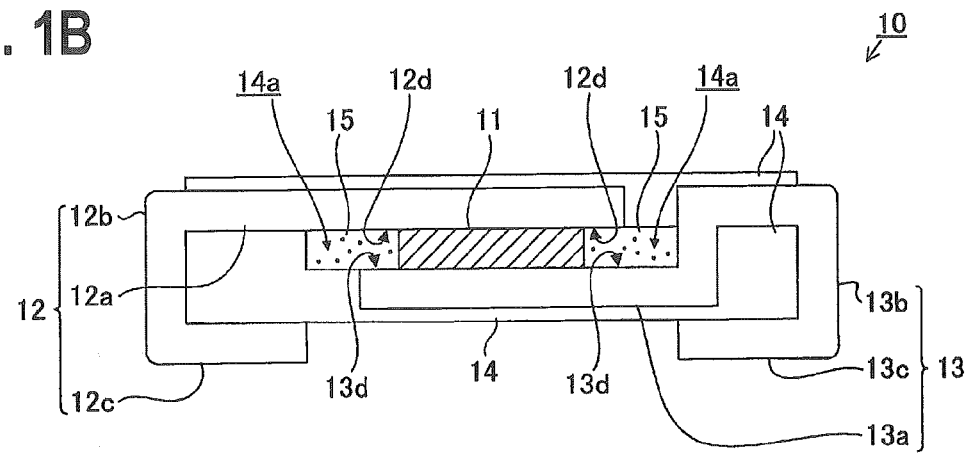
FIG. 1B is a front view of the light emitting device 10.
Figure 1C:
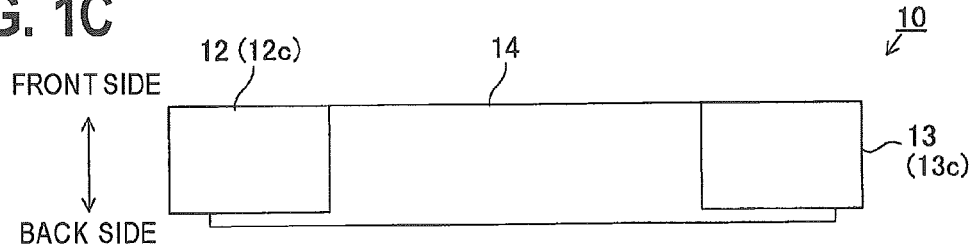
FIG. 1C is a bottom view of the light emitting device 10 and FIG. 1D is a rear view of the light emitting device 10.
Figure 3B:
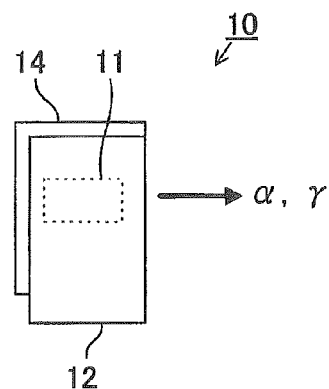
Figure 4A:
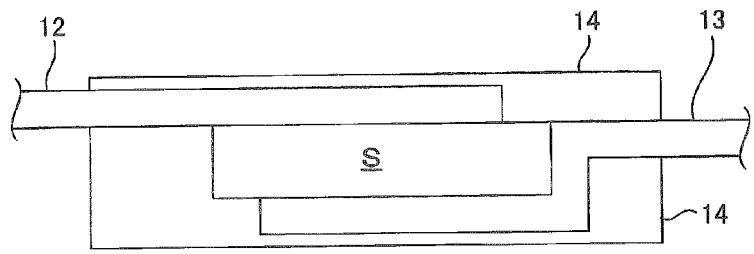
FIGS. 4A to 4D is front views for explaining a manufacturing process of the light emitting device 10.
Figure 4B:
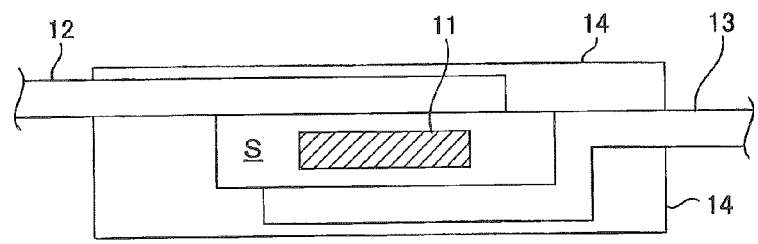
Figure 4C:
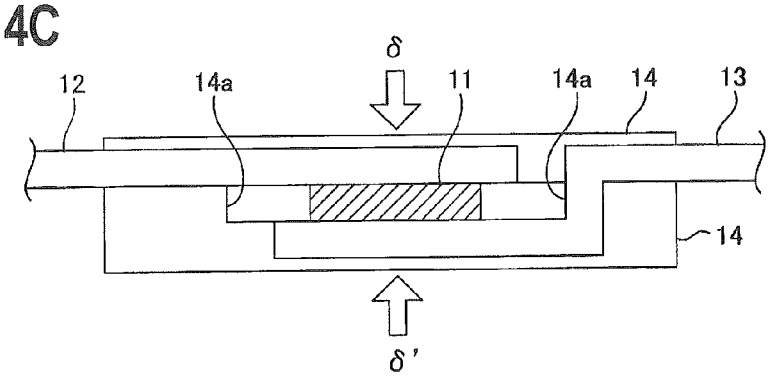
Figure 4D:
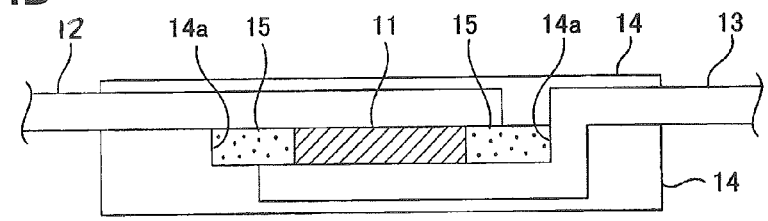

As shown in FIG. 1B and FIGS. 3A and 3B, in the front side (the lower side in FIG. 3A and the right side in FIG. 3B) of the light emitting device 10, an end surface of respective lead frames 12, 13 and an end surface of the sealing material 15 are not covered with the case 14 but exposed.

Figure 1D:
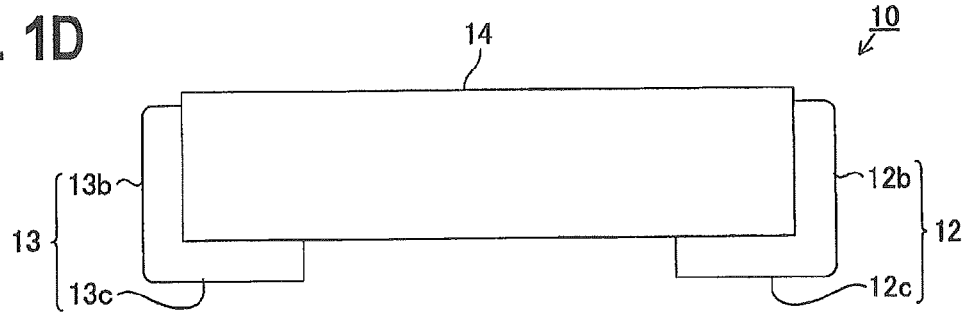

As shown in FIG. 1D and FIG. 3, in the rear side (the upper side in FIG. 3A and the left side in FIG. 3B) of the light emitting device 10, the end surface of respective lead frames 12, 13 and the end surface of the sealing material 15 are not exposed but covered by the case 14.

As shown in FIG. 1B, the upper and lower sides of the LED chip 11 are sandwiched between the side portions 12a, 13a of respective lead frames 12, 13. Accordingly, the light emitted in the normal direction from the c-plane of the LED chip 11 is blocked by the side portions 12a, 13a so that the light is hardly irradiated to the outside of the light emitting device 10.

As shown in FIGS. 3A and 3B, the light emitted in the normal direction from the a-plane on the rear side of the light emitting device 10, of two a-planes (see FIGS. 2A and 2B) of the LED chip 11, is blocked by the case 14, so that the light is hardly irradiated to the outside of the light emitting device 10.

As indicated by an arrow α in FIGS. 3A and 3B, the blue light emitted in the normal direction from the a-plane on the front side of the light emitting device 10, of two a-planes (see FIGS. 2A and 2B) of the LED chip 11, is transmitted through the sealing material 15, converted into white light by the phosphors contained in the sealing material 15 and then irradiated to the outside from the front side of the light emitting device 10.

Here, a portion of the light emitted in the normal direction from the a-plane on the front side of the light emitting device 10 is reflected by the reflective portions 12d, 13d of respective lead frames 12, 13 positioned on the front side of the light emitting device 10 and then irradiated to the outside from the front side of the light emitting device 10.

As indicated by an arrow β in FIG. 3A, the blue light emitted in the normal direction from two m-planes (see FIGS. 2A and 2B) of the LED chip 11 is transmitted through the sealing material 15 and converted into white light by the phosphors contained in the sealing material 15. Then, the white light is reflected by the reflective portions 12d, 13d of respective lead frames 12, 13 or the portion of the case 14 forming an inner wall surface of the void 14a and irradiated to the outside from the front side of the light emitting device 10, as indicated by an arrow γ.

[Manufacturing Method of Light Emitting Device 10]

First process (see FIGS. 2A and 2B): Each of the layers 11a to 11e, 11g and 11h is formed on a gallium nitride wafer that is the conductive board 11f and then divided into a predetermined size and shape, thereby manufacturing the LED chip 11.

At this time, the wafer is divided in such a way that a long-side wall surface of the LED chip 11 is the a-plane and a short-side wall surface thereof is the m-plane.

Upon dividing the wafer, fine irregularities are liable to be formed on the a-plane of the LED chip 11.

Second process (see FIG. 4A): During injection molding of the case 14, each of the straight lead frames 12, 13 before being bent is insert-molded.

At this time, a void S is provided in the portion of the case 14 located between the lead frames 12, 13. The void S has a bottomed rectangular parallelepiped box shape whose portion facing the front side of the light emitting device 10 is opened.

Third process (see FIG. 4B): The LED chip 11 is inserted into the void S through an opening of the void S. The LED chip 12 is placed between the lead frames 12, 13.

At this time, as shown in FIGS. 2A and 2B and FIGS. 3A and 3B, the longitudinal direction of the LED chip 11 is disposed along the longitudinal direction of respective lead frames 12, 13 so that the long-side wall surface (a-plane) of the LED chip 11 faces the front side of the light emitting device 10.

Fourth process (see FIG. 4C): Load is simultaneously applied to the upper and lower surfaces of the case 14, as indicated by arrows δ, δ', while heating the whole structure (the LED chip 11, the lead frames 12, 13 and the case 14). In this way, the case 14 made of the thermoplastic synthetic resin material or the glass material is thermally deformed. Then, the LED chip 11 is sandwiched between the lead frames 12, 13 and then the case 14 is cured by cooling.

At this time, respective lead frames 12, 13 are pressed against the LED chip 11 through the case 14 and the LED chip 11 is fixedly bonded by being crimped between the lead frames 12, 13.

At the same time, the solder layers 11a, 11h (see FIGS. 2A and 2B) of the LED chip 11 are melted by heating and then cured. The electrode layers 11b, 11g of the LED chip 11 are soldered to the lead frames 12, 13 by the solder layers 11a, 11h.

Fifth process (see FIG. 4D): The void S formed in the case 14 in the second process is narrowed in the fourth process and the void 14a remains in the case 14.

At that time, the sealing material 15 is injected and filled into the void 14a and then cured.

Sixth process (see FIGS. 1A to 1D): The portions (corresponding to the side portions 12b and 12c, 13b and 13c) of respective lead frames 12, 13, which protrude from the case 14, are bent by pressing and brought into close contact with the side surface or lower surface of the case 14. In this way, each of the side portions 12b and 12c, 13b and 13c is formed and the light emitting device 10 is completed.

[Operation/Effect of First Embodiment]

According to the light emitting device 10 of the first embodiment, the following operation/effect can be achieved.

[1] The LED chip 11 is a double-sided electrode type semiconductor light emitting element which includes the electrode layer 11g (first electrode) formed on the front side and the electrode 11b (second electrode) formed on the rear side and emits light from the side wall surface thereof.

The first lead frame 12 is bonded to the whole surface of the electrode layer 11g. The second lead frame 13 is bonded to the whole surface of the electrode layer 11b. The side portions 12a, 13a of respective lead frames 12, 13 are embedded in the case 14.

The LED chip 11 is fixedly bonded by being sandwiched between the side portions 12a, 13a of respective lead frames 12, 13.

The portion of the first lead frame 12, which obliquely faces the side wall surface of the LED chip 11, is formed with the reflective portion 12d (first reflective portion).

The portion of the second lead frame 13, which obliquely faces the side wall surface of the LED chip 11, is formed with the reflective portion 13d (second reflective portion).

Accordingly, since, in the light emitting device 10, a wire bonding method is not used, it is possible to avoid the disadvantages of the (a) and (b).

Further, since, in the light emitting device 10, the heat generated by the LED chip 11 can be directly dissipated to respective lead frames 12, 13 from the electrodes 11b, 11g on both front and rear surfaces, it is possible to avoid the disadvantage of the (c) and it is possible to improve the heat dissipation efficiency of the LED chip 11.

Further, since, in the light emitting device 10, the LED chip 11 is sandwiched between the side portions 12a, 13a of respective lead frames 12, 13 and respective side portions 12a, 13a are embedded in the case, it is possible to cause the light emitting device 10, as a whole, to be thinner.

Furthermore, since respective lead frames 12, 13 are provided with respective reflective portions 12d, 13d, it is possible to control the directivity of the light emitted to the side from the front side of the light emitting device 10.

Further, since respective reflective portions 12d, 13d are parts of respective lead frames 12, 13, the light is not transmitted through the reflective portion. Accordingly, it is possible to avoid the disadvantage of the (d) and it is possible to improve the light emission efficiency of the light emitting device 10.

Particularly, in the case where respective lead frames 12, 13 are formed of metallic material having high reflectivity, the reflectivity of respective reflective portions 12d, 13d is also improved. Accordingly, it is possible to further improve the light emission efficiency of the light emitting device 10.

Further, since, in the light emitting device 10, the whole surface of respective electrode layers 11b, 11g is bonded to respective lead frames 12, 13, it is possible to lower the threshold voltage of the LED chip 11, in addition to being able to equalize the current density of current flowing through respective lead frames 12, 13 from respective electrode layers 11b, 11g.

Additionally, since the structure of the light emitting device 10 is simple, it is possible to reduce the cost.

[2] The portion inside the case 14 surrounded by the side wall surface of the LED chip 11 and the reflective portions 12d, 13d of respective lead frames 12, 13 is formed with the void 14a.

The sealing material 15 for sealing the side wall surface of the LED chip 11 is injected and filled into the void 14a. The sealing material 15 contains phosphors.

Accordingly, the blue light of the LED chip 11 can be converted into the white light by the phosphors and then irradiated to the outside from the light emitting device 10.

[3] The reflective portions 12d, 13d of respective lead frames 12, 13 are formed separately for two short-side wall surfaces (m-plane) of the LED chip 11 opposed to each other.

Namely, since each of the reflective portions 12d, 13d is provided by two, it is possible to more optimally control the directivity of the light emitted from the light emitting device 10. In this way, it is possible to further improve the light emission efficiency of the light emitting device 10.

[4] In the gallium nitride-based LED, piezoelectric field is generated in the normal direction (c-axis direction) of the c-plane that is a crystal plane of the gallium nitride crystal. Accordingly, the light emission efficiency of the emitted light in the normal direction of the c-plane is low whereas the light emission efficiency of the emitted light in the normal direction of the m-plane or the c-plane that is a non-polar plane of the gallium nitride crystal is improved.

The LED chip 11 is a gallium nitride-based LED having a flat rectangular parallelepiped shape.

A short-side wall surface of the LED chip 11 is the m-plane.

Two long-side wall surfaces of the LED chip 11 corresponding to the a-plane are arranged so as to face the front side and rear side of the light emitting device 10.

Accordingly, as indicated by arrows α to γ in FIGS. 2A and 2B and FIGS. 3A and 3B, the emitted light in the normal direction of the m-plane or the a-plane of the LED chip 11 can be irradiated to the outside of the light emitting device 10, so that it is possible to improve the light emission efficiency of the light emitting device 10.

It is noted that the c-plane and the m-plane may be interchanged with each other.

[5] Two short-side wall surfaces of the LED chip 11 corresponding to the a-plane are formed with fine irregularities.

Accordingly, the fine irregularities formed on the a-plane of the LED chip 11 allows the emitted light in the normal direction of the a-plane to be irradiated to the phosphors contained in the sealing material 15 over a wide range in the horizontal direction (lateral direction shown in FIG. 1A to FIG. 3B) of the front side of the light emitting device 10. Further, the phosphors contained in the sealing material 15 can be effectively used. Accordingly, it is possible to improve the light emission efficiency of the light emitting device 10.

[6] In the LED chip 11, the solder layers 11a, 11h (bonding material layers) are respectively formed on the surfaces of respective electrode layers 11b, 11g.

Accordingly, the side portions 12a, 13a of respective lead frames 12, 13 can be more securely bonded to respective electrode layers 11b, 11g via the solder layers 11a, 11h. Further, it is possible to further improve the heat dissipation efficiency in the [1] and it is possible to further equalize the current density in the [1].

Additionally, it is possible to improve the bonding strength between respective lead frames 12, 13 and respective electrode layers 11b, 11g by providing the solder layers 11a, 11h.

[7] The side portions 12b and 12c, 13a and 13c (portions protruding from the case 14) of respective lead frames 12, 13 are bent so as to follow the outer surface of the case 14.

As in the [1], the LED chip 11 is fixedly bonded to respective lead frames 12, 13 and the bending of respective lead frames 12, 13 can be easily performed. Accordingly, it is possible to reduce the manufacturing cost of the light emitting device 10.

Second Embodiment

Similar to the light emitting device 10 of the first embodiment, a light emitting device 20 of a second embodiment includes the LED chip 11, the first lead frame 12 (the side portions 12a to 12c and the reflective portion 12d), the second lead frame 13 (the side portions 13a to 13c and the reflective portion 13d), the case 14 (the void 14a) and the sealing material 15.

Figure 5A:
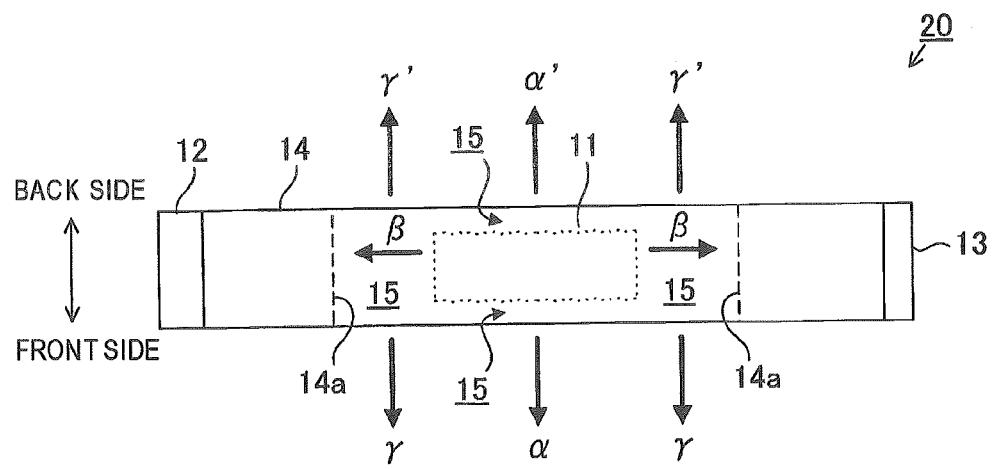
FIG. 5A is a perspective top view of a main part of a light emitting device 20 according to a second embodiment of the present invention and FIG. 5B is a perspective left-side view of a main part of the light emitting device 20.
Figure 5B:
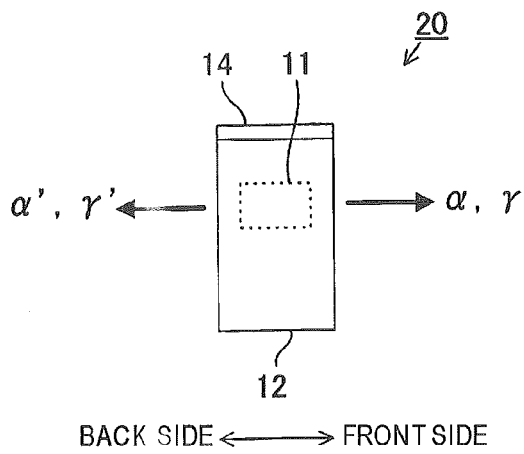

The light emitting device 20 of the second embodiment shown in FIGS. 5A and 5B is different from the light emitting device 10 of the first embodiment shown in FIGS. 3A and 3B only in that, at the rear side of the light emitting device 20, a cross-section of respective lead frames 12, 13 and a cross-section of the sealing material 15 are not covered by the case 14 but exposed.

Namely, a configuration at the rear side of the light emitting device 20 is the same as the front side of the light emitting device 10 shown in FIG. 1B.

Therefore, similar to the light emitting device 10 shown in FIG. 3B, the light is irradiated to the outside from the front side of the light emitting device 20, as indicated by the arrows α, γ in FIGS. 5A and 5B.

At the same time, the light is also irradiated to the outside from the rear side of the light emitting device 20, as indicated by arrows α', γ' in FIGS. 5A and 5B.

Accordingly, according to the second embodiment, it is possible to achieve a side-view type light emitting device 20 where the light can be equally irradiated in two directions of the front side and rear side.

Another Embodiment

The present invention is not limited to each of the above-described embodiments but may be embodied as follows. Also in these cases, it is possible to obtain the operation/effect equal to or better than each of the above-described embodiments.

[A] The LED chip 11 is not limited to the gallium nitride-based LED but may be substituted with any LED or any semiconductor light emitting element (e.g., organic EL chip or the like).

[B] The solder layers 11a, 11h of the LED chip 11 may be substituted with any bonding material layer. For example, the solder layers 11a, 11h may be substituted with a thermoplastic conductive resin layer or a layer of metallic fine particle bonding material (gold, silver, palladium, copper, etc.)

Further, phosphors may be contained in the conductive resin layer that substitutes for the solder layers 11a, 11h.

[C] The lead frames 12, 13 are not limited to the metallic material but may be formed by any conductive material (e.g., conductive synthetic resin, etc.).

[D] The LED chip 11 may be fixedly bonded to respective lead frames 12, 13 and integrated therewith. Then, the case 14 may be injection-molded. During the injection molding, the LED chip 11 integrated and respective lead frames 12, 13 may be insert-molded in the case 14.

The present invention is not limited to the description of respective embodiments and each of the aspects. The present invention also includes various modifications which can be easily conceived by those skilled in the art without departing from the description of the claims. The contents of publications mentioned in the present specification are incorporated by reference in its entity.

What is claimed is:

1. A light emitting device comprising:
    a double-sided electrode type semiconductor light emitting element that has a first electrode formed on a front side of the double-sided electrode type semiconductor light emitting element and a second electrode formed on a rear side of the double-sided electrode type semiconductor light emitting element and is configured to emit light from a side wall surface of the double-sided electrode type semiconductor light emitting element;
    a first lead frame that is bonded to a whole area of one face of the first electrode;
    a second lead frame that is bonded to a whole area of one face of the second electrode; and
    a case in which a portion of the first lead frame and a portion of the second lead frame are embedded,
    wherein the double-sided electrode type semiconductor light emitting element is fixedly bonded by being disposed between the first lead frame and the second lead frame,
    the first lead frame includes a first reflective portion formed at the portion which obliquely faces the side wall surface of the double-sided electrode type semiconductor light emitting element, and
    the second lead frame includes a second reflective portion formed at the portion which obliquely faces the side wall surface of the double-sided electrode type semiconductor light emitting element, the light emitting device further comprising:
    a void that is formed at the portion inside the case surrounded by the side wall surface of the double-sided electrode type semiconductor light emitting element and the first and second reflective portions; and
    a sealing material that is injected and filled into the void and configured to seal the side wall surface of the double-sided electrode type semiconductor light emitting element, and
    wherein phosphors are contained in the sealing material.

2. The light emitting device according to claim 1, wherein the first reflective portion and the second reflective portion are formed separately for two side wall surfaces of the double-sided electrode type semiconductor light emitting element opposed to each other.

3. The light emitting device according to claim 1, wherein bonding material layers are formed on the surfaces of the first electrode and the second electrode, and the first and second lead frames and the first and second electrodes are bonded to each other via the bonding material layers.

4. The light emitting device according to claim 1, wherein the portions of the first lead frame and the second lead frame which protrude from the case are bent so as to follow an outer surface of the case.

5. A light emitting device comprising:
    a double-sided electrode type semiconductor light emitting element that has a first electrode formed on a front side of the double-sided electrode type semiconductor light emitting element and a second electrode formed on a rear side of the double-sided electrode type semiconductor light emitting element and is configured to emit light from a side wall surface of the double-sided electrode type semiconductor light emitting element;
    a first lead frame that is bonded to a whole area of one face of the first electrode;
    a second lead frame that is bonded to a whole area of one face of the second electrode; and
    a case in which a portion of the first lead frame and a portion of the second lead frame are embedded,
    wherein the double-sided electrode type semiconductor light emitting element is fixedly bonded by being disposed between the first lead frame and the second lead frame,
    the first lead frame includes a first reflective portion formed at the portion which obliquely faces the side wall surface of the double-sided electrode type semiconductor light emitting element, and
    the second lead frame includes a second reflective portion formed at the portion which obliquely faces the side wall surface of the double-sided electrode type semiconductor light emitting element,
    wherein the double-sided electrode type semiconductor light emitting element comprises a gallium nitride-based light emitting diode (LED) having a flat rectangular parallelepiped shape, two side wall surfaces of the double-sided electrode type semiconductor light emitting element corresponding to an a-plane that is a non-polar plane of the gallium nitride crystal are arranged so as to face the front side and rear side of the light emitting device, and wherein the two side wall surfaces of the double-sided electrode type semiconductor light emitting element corresponding to the a-plane are formed with fine irregularities.

6. The light emitting device according to claim 5, further comprising:

a void that is formed at the portion inside the case surrounded by the side wall surface of the double-sided electrode type semiconductor light emitting element and the first and second reflective portions; and a sealing material that is injected and filled into the void.

7. The light emitting device according to claim 5, wherein portions of the first lead frame and the second lead frame each includes side portions bent to form a substantially J-shape.

8. The light emitting device according to claim 5, wherein the first lead frame includes a first exposed portion that is exposed from a first side surface of the case and is arranged perpendicular to the double-sided electrode type semiconductor light emitting element, and wherein the second lead frame includes a first exposed portion that is exposed from a second side surface of the case and is arranged perpendicular to the double-sided electrode type semiconductor light emitting element.

9. The light emitting device according to claim 8, wherein the first lead frame includes a second exposed portion that is exposed from the side wall surface of the case and is arranged parallel to the double-sided electrode type semiconductor light emitting element, and wherein the second lead frame includes a second exposed portion that is exposed from the side wall surface of the case and is arranged parallel to the double-sided electrode type semiconductor light emitting element.

10. The light emitting device according to claim 5, wherein the first lead frame includes an exposed portion that is exposed from the side wall surface of the case which is parallel to the double-sided electrode type semiconductor light emitting element, and wherein the second lead frame includes an exposed portion that is exposed from the side wall surface of the case which is parallel to the double-sided electrode type semiconductor light emitting element.

11. The light emitting device according to claim 5, wherein the first lead frame includes an exposed portion that is exposed from the case and overlaps with a portion of the first lead frame which obliquely faces the side wall surface of the double-sided electrode type semiconductor light emitting element, and wherein the second lead frame includes an exposed portion that is exposed from the case and overlaps with a portion of the second lead frame which obliquely faces the side wall surface of the double-sided electrode type semiconductor light emitting element.

\* \* \* \* \*